(12) United States Patent
Chen et al.

(10) Patent No.: US 9,326,380 B2
(45) Date of Patent: Apr. 26, 2016

(54) UNIVERSAL SERIAL BUS HYBRID FOOTPRINT DESIGN

(71) Applicant: INTEL CORPORATION, Santa Clara, CA (US)

(72) Inventors: Kuan-Yu Chen, Hillsboro, OR (US); Howard L. Heck, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 13/727,701

(22) Filed: Dec. 27, 2012

(65) Prior Publication Data

US 2014/0182914 A1 Jul. 3, 2014

(51) Int. Cl.
| | |
|---|---|
| *H05K 1/11* | (2006.01) |
| *H05K 1/03* | (2006.01) |
| *H05K 3/00* | (2006.01) |
| *H01R 12/57* | (2011.01) |
| *H05K 1/02* | (2006.01) |
| *H01R 12/58* | (2011.01) |

(52) U.S. Cl.
CPC .................. *H05K 1/11* (2013.01); *H01R 12/57* (2013.01); *H01R 12/58* (2013.01); *H05K 1/025* (2013.01); *H05K 1/111* (2013.01); *H05K 1/115* (2013.01); *H05K 2201/094* (2013.01); *H05K 2201/09409* (2013.01); *H05K 2201/10189* (2013.01); *H05K 2201/10659* (2013.01); *Y10T 29/49124* (2015.01)

(58) Field of Classification Search
CPC .. H01R 12/57; H01R 12/58; Y10T 29/49124; H05K 1/111; H05K 1/115; H05K 2201/09409; H05K 1/11

USPC .............................. 174/262–266, 255; 29/829
See application file for complete search history.

(56) References Cited

U.S. PATENT DOCUMENTS

| | | | | |
|---|---|---|---|---|
| 4,891,789 | A | * | 1/1990 | Quattrini et al. ................. 365/63 |
| 7,242,592 | B2 | * | 7/2007 | Payne et al. .................... 361/792 |
| 7,837,499 | B1 | * | 11/2010 | Chen ......................... 439/541.5 |
| 2002/0104683 | A1 | * | 8/2002 | Teshima et al. ................ 174/262 |
| 2002/0157861 | A1 | * | 10/2002 | Arrington et al. ............. 174/255 |
| 2002/0195271 | A1 | * | 12/2002 | Gailus ........................... 174/262 |
| 2003/0006061 | A1 | * | 1/2003 | Brinthaupt et al. ............ 174/255 |
| 2007/0091581 | A1 | * | 4/2007 | Gisin et al. .................... 361/782 |
| 2007/0143509 | A1 | * | 6/2007 | Ni et al. ......................... 710/100 |
| 2007/0171620 | A1 | | 7/2007 | Lee |
| 2009/0098773 | A1 | * | 4/2009 | Cheng et al. .............. 439/607.22 |

(Continued)

FOREIGN PATENT DOCUMENTS

| | | |
|---|---|---|
| CN | 102402710 A | 4/2012 |
| TW | M436963 | 9/2012 |
| WO | 2014/105623 A1 | 7/2014 |

OTHER PUBLICATIONS

International Search Report and Written Opinion received for PCT Patent Application No. PCT/US2013/076507, mailed on Apr. 9, 2014, 10 pages.

*Primary Examiner* — Sherman Ng
(74) *Attorney, Agent, or Firm* — International IP Law Group, P.L.L.C.

(57) ABSTRACT

A universal serial bus hybrid footprint design is described herein. The design includes an outer row of one or more surface mount technology (SMT) contacts and an inner row of one or more printed through holes (PTH). The hybrid footprint design enables a data through put of at least 10 Gbps.

20 Claims, 7 Drawing Sheets

(56) References Cited

U.S. PATENT DOCUMENTS

| | | | |
|---|---|---|---|
| 2009/0223710 A1* | 9/2009 | Becker et al. | 174/264 |
| 2010/0012366 A1* | 1/2010 | Takeda | 174/261 |
| 2010/0044095 A1* | 2/2010 | Kuczynski et al. | 174/266 |
| 2010/0048043 A1* | 2/2010 | Morlion et al. | 439/78 |
| 2010/0159751 A1* | 6/2010 | Chiu et al. | 439/660 |
| 2010/0200287 A1* | 8/2010 | Tsubamoto | 174/262 |
| 2012/0004762 A1 | 1/2012 | Bauer et al. | |
| 2012/0030943 A1 | 2/2012 | Hiew et al. | |
| 2012/0033369 A1* | 2/2012 | Wu et al. | 361/679.4 |
| 2012/0052731 A1 | 3/2012 | Hsiao et al. | |
| 2012/0057867 A1* | 3/2012 | Lin et al. | 398/43 |
| 2012/0100754 A1 | 4/2012 | He et al. | |

\* cited by examiner

400

UNIVERSAL SERIAL BUS HYBRID FOOTPRINT DESIGN

TECHNICAL FIELD

The present invention relates generally to a connector design. More specifically, the present invention relates to a universal serial bus (USB) hybrid footprint design.

BACKGROUND ART

The USB is a standard bus used to interface with various peripheral devices. The USB can also provide power to peripheral devices, eliminating the need for an external power supply. The USB 1.0 specification supports data transfer rates of up to 12 megabits per second (MBPS). USB 2.0 can support low-speed, full-speed, and high speed USB applications, as well as data transfer rates up to 480 MBPS. USB 3.0 can support super speed USB applications, and a data transfer rate of 5 gigabits per second (GBPS).

BRIEF DESCRIPTION OF THE DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

Figure 1:
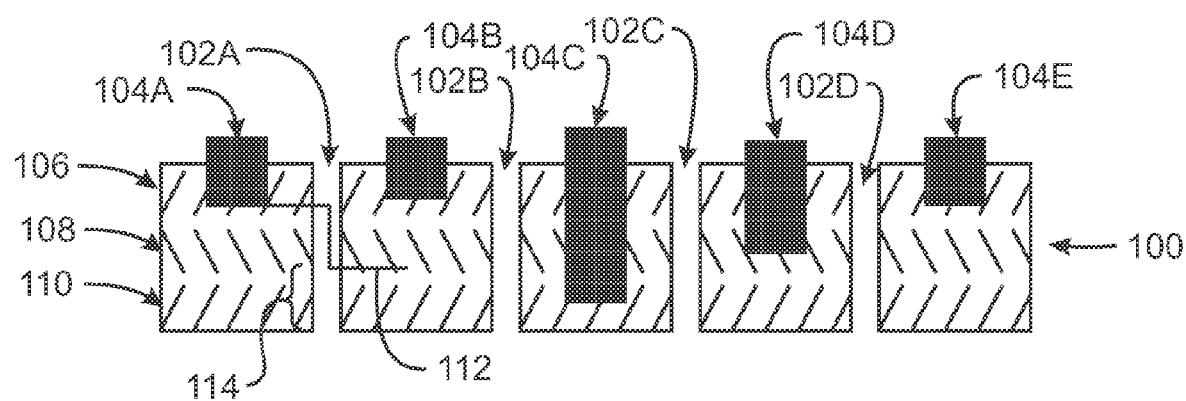
FIG. 1 is an illustration of a printed circuit board, in accordance with embodiments of the present invention.

As discussed above, USB 3.0 can support super speed USB applications, and a data transfer rate of 5 GBPS. However, future platforms possess higher bandwidths than what is offered by USB 3.0. The 5 GBPS data transfer rate is not fast enough for high-definition and high-quality content. Accordingly, optimizing the existing USB 3.0 for bandwidths higher than 5 GBPS enables support for high performance applications while maintaining backward compatibility with previous USB versions.

Embodiments described herein achieve at least a 10 GBPS data transfer rate by using a hybrid USB connector with an optimized connector footprint. Further, embodiments described herein remove the excessive via stubs that occur when using printed through hole via (PTH). In this manner, low impedance and any resulting impedance mismatch is avoided. Additionally, the signals are not degraded because of the impedance mismatch. Further, surface mount technology (SMT) is applied in a manner that enables removing the associated via stubs, while not compromising the ability for visual soldering inspection during the manufacturing process.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the inventions. The various appearances of "an embodiment," "one embodiment," or "some embodiments" are not necessarily all referring to the same embodiments. Elements or aspects from an embodiment can be combined with elements or aspects of another embodiment.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

FIG. 1 is an illustration of a printed circuit board 100, in accordance with embodiments. The printed circuit board (PCB) 100 includes surface mount technology (SMT) contacts 104A, 104B, 104C, 104D, and 104E. The printed circuit board also includes vias 102A, 102B, 102C, and 102D. The PCB consists of several layers. For example, the PCB 100 includes layers 106, 108, and 110. Although three layers are shown, the PCB 100 can have any number of layers.

Multiple signal traces or conductive regions reside within each layer, separated by an insulating material. When routing the USB signals through the PCB, traces use the vias to route between the different layers of the PCB 100. As shown, the vias 102A, 102B, 102C, and 102D are printed thru-hole (PTH) vias. However, any type of via may be used, including blind vias and vias that do not extend to the bottom layer 110 of the PCB 100.

The PTH vias 102A, 102B, 102C, and 102D also include a via stub that is a non-functional portion of the via. A via stub contains no signal traces, so it performs no function. For example, if a signal trace 112 was routed from the layer 106 to the layer 108 using the via 102A, the portion of the via 102A within the layer 110 would be non-functional and called a via stub 114. The presence of large numbers of via-stubs in a PCB can distort the signal traces routed through the PCB. For example, an impedance mismatch between the PCB 100 and the via stub 114 can degrade the signal trace 112. The distortion is especially apparent when high speed digital signals are routed through the signal trace.

As shown in FIG. 1, the signal trace 112 is routed to a SMT contact 102. The portion of the SMT contact 104A that is above the surface of the PCB 100 is referred to as an SMT pad. An electrical component of the USB connector can be mounted to the PCB 100 by soldering the electrical component to the PCB using the SMT pad. The SMT contacts typically have a lower resistance and inductance that the contact location when compared to PTH vias. Accordingly, SMT contacts typically have an increased signal integrity when compared to PTH vias. In this manner, the SMT contacts are better suited for high speed digital signals when compared to PTH vias. During manufacturing, the SMT contacts enable the board to be visually inspected for any misalignments, defective soldering, or missing electrical components. Additionally, as a result of the soldering, the SMT contacts have good mechanical performance under the standard shake and vibrate tests performed on USB connectors.

The SMT contacts 104A, 104B, 104C, 104D, and 104E form an outer row of contacts for a USB connector, while the PTH vias 102A, 102B, 102C, and 102D form an inner row of contacts for a USB connector. In this manner, the USB connector can be visually inspected during the manufacturing process while maintaining satisfactory performance during the USB shake and vibrate testing.

Figure 2:
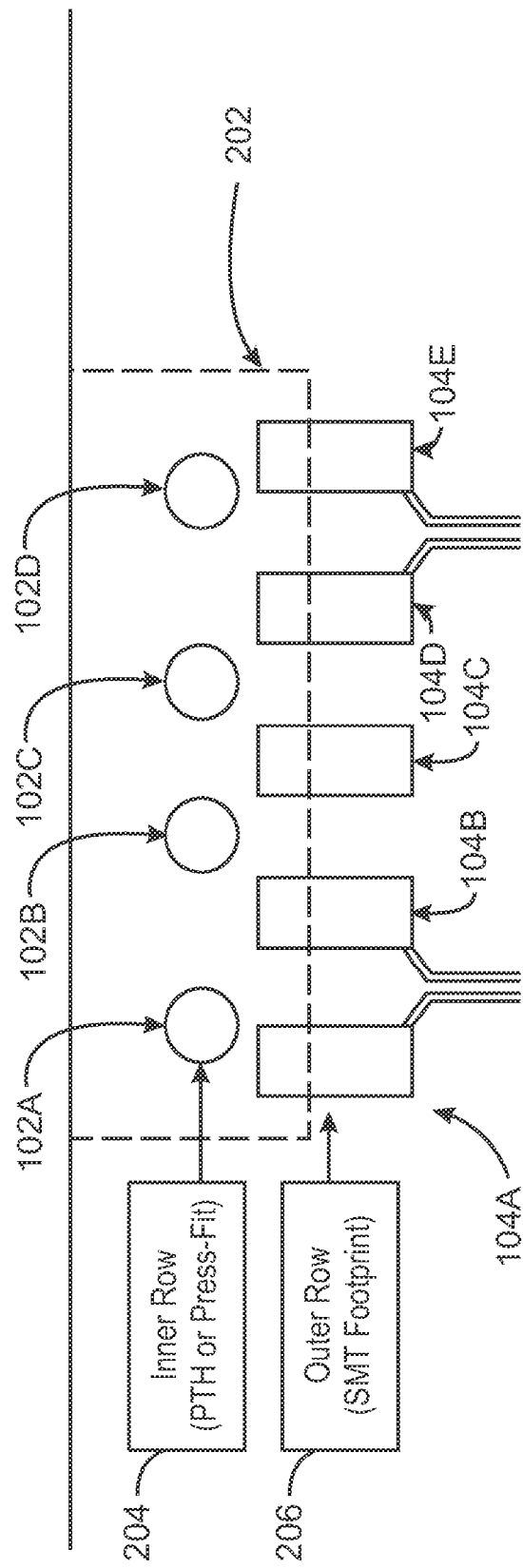
FIG. 2 is an illustration of a hybrid footprint of a USB connector, in accordance with embodiments.

FIG. 2 is an illustration of a hybrid footprint 200 of a USB connector, in accordance with embodiments. In embodiments, the hybrid footprint that can be used with both a USB host and a USB device connector. The hybrid footprint enables higher speed data transfer rates beyond what is achievable with USB 3.0.

A USB connector outline 202 is illustrated using a dashed line. The printed through holes (PTH) 102A, 102B, 102C, and 102D form an inner row 204 of contacts. In embodiments, the inner row 204 may include press fit contacts. The inner row 102 may be used to transfer high speed data or low speed data. The SMT contacts 104A, 104B, 104C, 104D, and 104E form an outer row 206 of contacts. The outer row 206 of SMT contacts 104A, 104B, 104C, 104D, and 104E may be used to transfer super speed data.

Through the configuration of the inner row 204 of PTH 102A, 102B, 102C, and 102D and the outer row 206 of SMT 104A, 104B, 104C, 104D, and 104E contacts, the impedance mismatches caused by the via stub effect is eliminated. The footprint 200 performs better than, for example, a two-row footprint that contains two rows of SMT contacts. Such a configuration enables crosstalk between the USB 2.0 signals and the USB 3.0 signals. Additionally, the footprint 200 performs better when compared to a single row of alternating SMT contacts and PTH contacts. Such a footprint suffers from the degradation of signal traces from the via stub effect.

Figure 3:
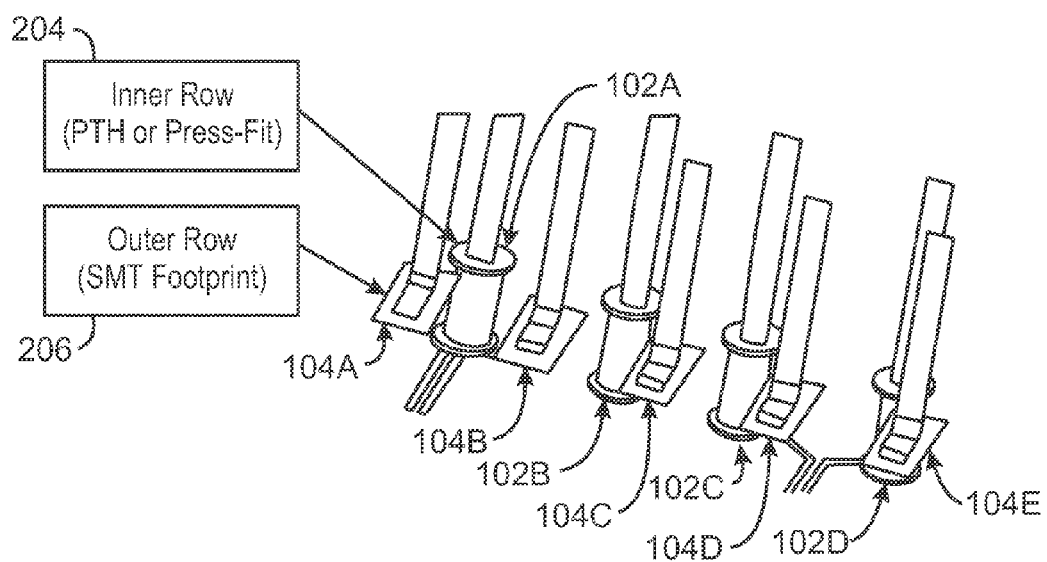
FIG. 3 is an illustration of a profile view of a hybrid footprint of a USB connector, in accordance with embodiments.

FIG. 3 is an illustration of a profile view of a hybrid footprint 200 of a USB connector, in accordance with embodiments. The outer row 206 of SMT contacts 104A, 104B, 104C, 104D, and 104E are visible from the outside of the connector, enabling the visual inspection in the manufacturing process to be maintained by using SMT contacts on the outer row. Further, through the combination of PTH and SMT contacts, the electrical parasitic capacitance caused by via stub of the PTH is reduced without sacrificing the retention force provided by the PTH.

The inner row 204 of PTH 102A, 102B, 102C, and 102D enables a higher retention force to be maintained when compared to SMT contacts. Further, the retention force applied satisfies the performance required by the USB shock and vibration test. In embodiments, channel performance in terms of impedance match is improved when compared to other USB connectors.

Figure 4:
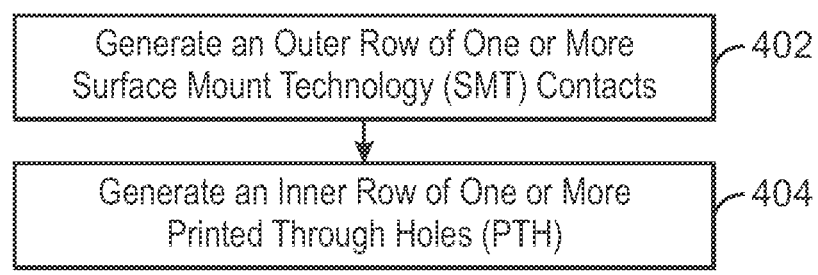
FIG. 4 is a process flow diagram of a method for providing a hybrid USB footprint, in accordance with embodiments.

FIG. 4 is a process flow diagram of a method 400 for providing a hybrid USB footprint, in accordance with embodiments.

At block 402, an outer row of one or more surface mount technology (SMT) contacts is generated. The outer row may be closer to an outer edge of the footprint when compared to an inner row. As a result of the better performance with high speed digital data or Super Speed Data, the SMT contacts of the outer row can transmit these signal traces with less signal degradation when compare to PTHs. Moreover, the connector is configured in a manner that can be visually inspected during manufacturing.

At block 404, an inner row of one or more printed through holes (PTH) is generated. The PTHs may transmit data that is compatible with USB data, USB 1.0 data, USB 2.0 data, or any combination thereof. The PTHs may enable a retention force that satisfies a USB shock and vibration test.

In embodiments, the total data throughput of the USB footprint as described herein is equal to or greater than 10 GBPS. This speed is the result of, in part, the reduced signal distortion from the via stub effect. Further, the footprint of the surface mount technology contacts and the through holes as illustrated above maintains a signal integrity between data signals transmitted by the one or more surface mount technology contacts and the one or more printed through holes.

The process flow diagram of FIG. 4 is not intended to indicate that the blocks of method 300 are to be executed in any particular order, or that all of the blocks are to be included in every case. Further, any number of additional blocks may be included within the method 400, depending on the details of the specific implementation.

Figure 5:
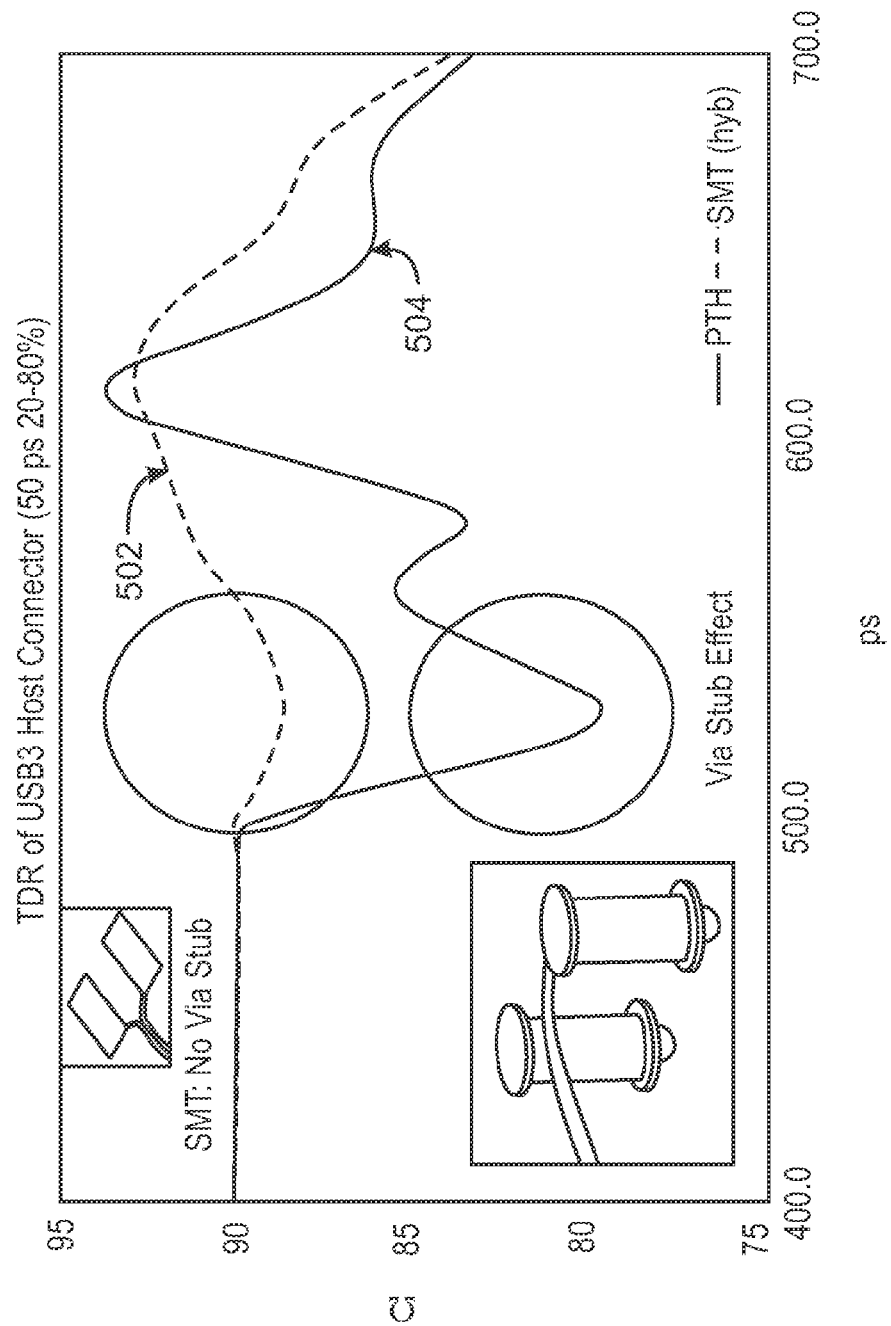
FIG. 5 is a graph of the TDR of USB3 host connector, in accordance with embodiments.

FIG. 5 is a graph of time domain reflectometry (TDR) of USB3 host connector, in accordance with embodiments. The TDR can be used to compare electrical signals based on reflected waveforms. The line 502 represents the signal quality of a surface mount connector. The line 504 represents the signal quality of a PTH connector.

The large dip in line 504 represents a large impedance mismatch that occurs in the PTH connector. The large impedance is due to the via stub effect as discussed above. Specifically, the signal quality of the USB connector consisting of only PTHs drops to below 80 OH Ms at approximately 530.00 ps. By contrast, the line 502 represents the performance of the hybrid footprint as discussed above. As the at approximately 530.00 ps, the resistance of the hybrid footprint drops to approximately 89 OHMs, resulting in a lower impedance mismatch. Accordingly, a signal trace using the hybrid footprint would suffer less distortion when compared to a signal trace using only PTHs.

Figure 6A:
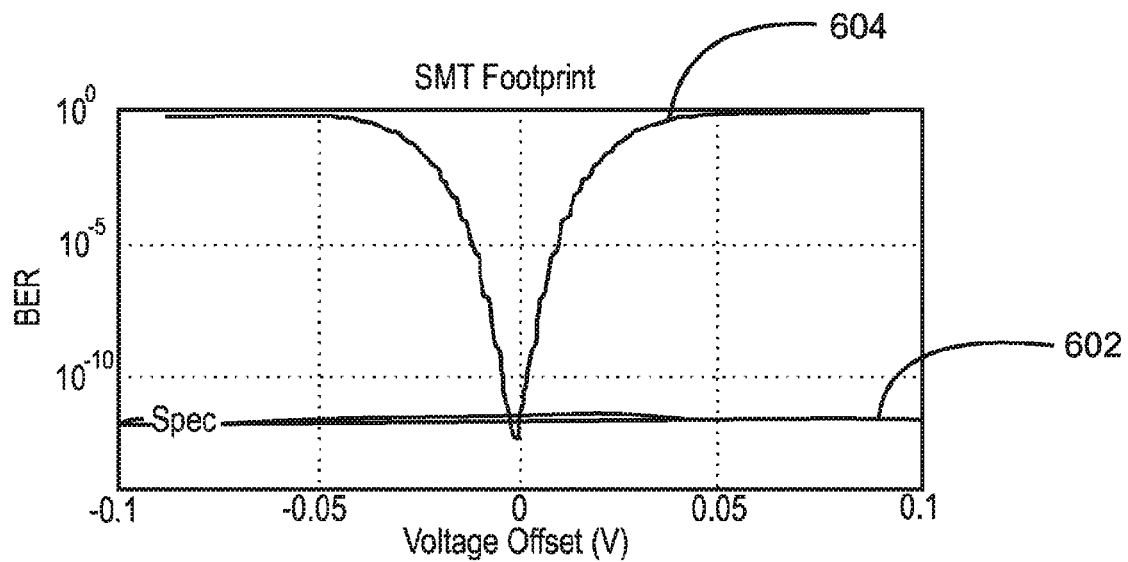
FIG. 6A is graph representing the bit error ration of SMT contacts, in accordance with embodiments.

FIG. 6A is graph representing the bit error ratio of SMT contacts, in accordance with embodiments. The line at 602 illustrates the bit error ratio as specified for USB connections. Specifically, the bit error ratio as established by the USB standards is 1e-12 with a margin deficit for voltage at −24 mV and timing at 18 ps. The SMT footprint enables an SMT connector to operate at 25 mV and 22 ps, using only 25% of the cell bit width. As a result, the SMT footprint enables positive operating margins of 1 mV and 4 ps. Additionally, the plot 604 of an SMT footprint satisfies the required bit error ratio at a minimum BER of approximately 1e-13.

Figure 6B:
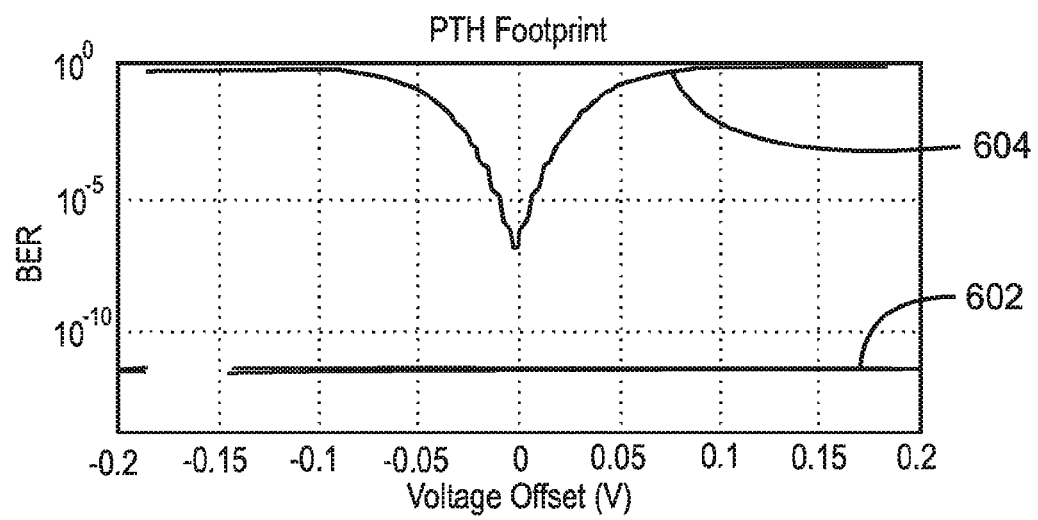
FIG. 6B is graph representing the bit error ration of PTH, in accordance with embodiments.

FIG. 6B is graph representing the bit error ratio of PTH footprint, in accordance with present embodiments. The plot 606 of a PTH footprint does not satisfy the required BER, as the minimum BER of the PHT footprint is approximately 1e-7.

Figure 7:
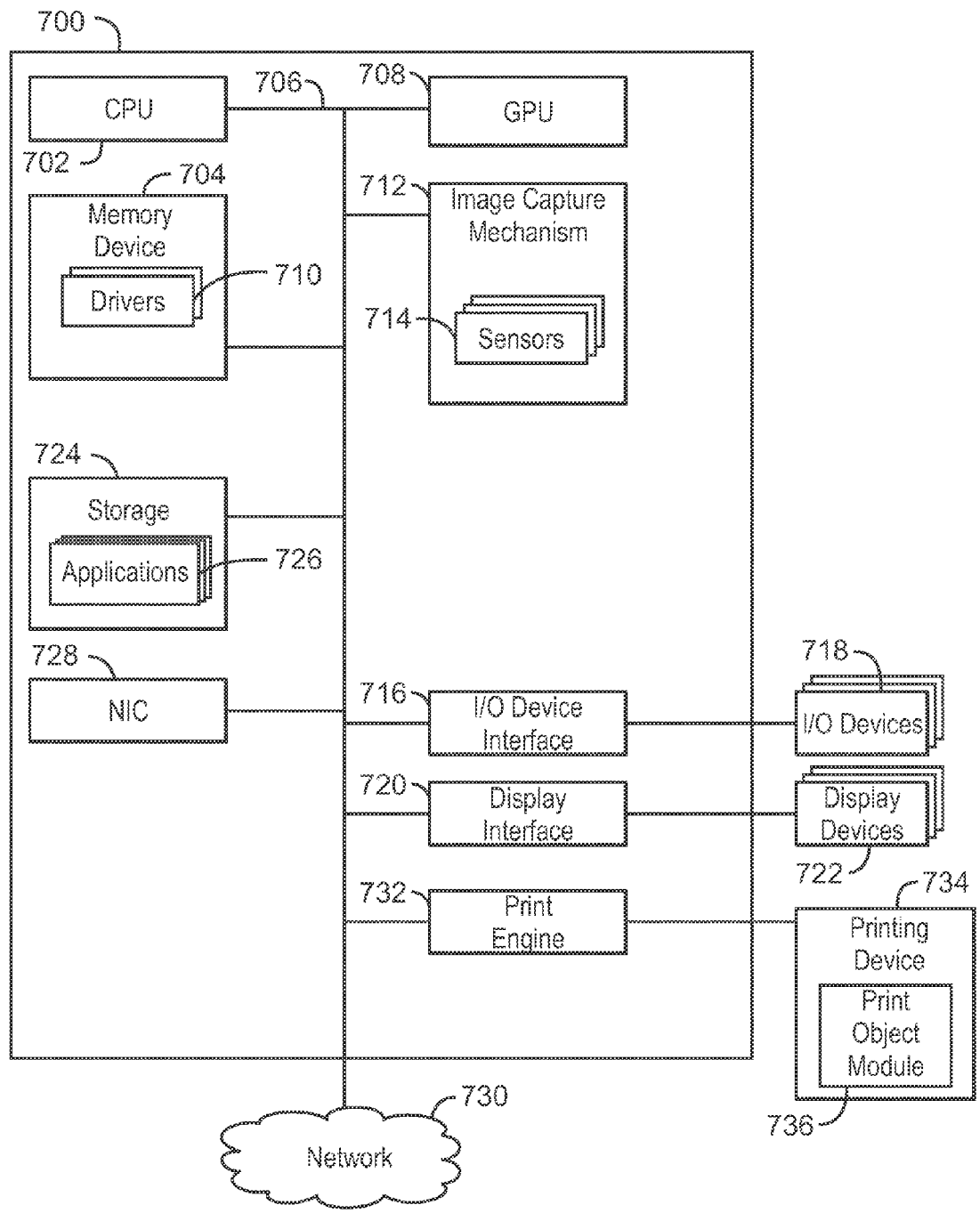
FIG. 7 is a block diagram of a computing device that may be used in accordance with embodiments.

FIG. 7 is a block diagram of a computing device 700 that may be used in accordance with embodiments. The computing device 700 may be a mobile computing device, such as a mobile phone, for example. In such embodiments, the computing device 700 may be implemented as a system-on-a-chip (SOC). The computing device 700 may also be any other suitable type of computing device, such as a laptop computer, desktop computer, tablet computer, mobile device, or server, among others. The computing device 700 may include a central processing unit (CPU) 702 that is configured to execute stored instructions, as well as a memory device 704 that stores instructions that are executable by the CPU 702. The CPU 702 may be coupled to the memory device 704 by a bus 706. Additionally, the CPU 702 can be a single core processor, a multi-core processor, a computing cluster, or any number of other configurations. Furthermore, the computing device 700 may include more than one CPU 702.

The memory device 704 can include random access memory (RAM), read only memory (ROM), flash memory, or any other suitable memory systems. For example, the memory device 704 may include dynamic random access memory (DRAM). The CPU 702 may be connected through the bus 706 to an input/output (I/O) device interface 708 configured to connect the computing device 700 to one or more I/O devices 710. The I/O devices 710 may include, for example, a keyboard and a pointing device, wherein the pointing device may include a touchpad or a touchscreen, among others. The I/O devices 710 may be built-in components of the computing device 700, or may be devices that are externally connected to the computing device 700. In embodiments, the I/O devices 710 may connect to the computing device 700 using any USB standard.

The CPU 702 may also be linked through the bus 706 to a display interface 712 to an image capture mechanism 714 that includes sensors 714. The image capture mechanism may be connector to the computing device 700 using any USB standard. Additionally, the computing device 100 may include an input/output (I/O) device interface 716 connected to one or more I/O devices 718 using any USB standard. The I/O devices 118 may include, for example, a keyboard and a pointing device, wherein the pointing device may include a touchpad or a touchscreen, among others.

The computing device 700 includes a display interface 720 that interfaces with display devices 722. A display device 722 may include a display screen that is a built-in component of the computing device 700. A display device 722 may also include a computer monitor, television, or projector, among others, that is externally connected to the computing device 700. In embodiments, the display device 722 may connect to the computing device 700 using any USB standard.

The computing device may also include a storage device 724. The storage device 724 is a physical memory such as a hard drive, an optical drive, a thumbdrive, an array of drives, or any combinations thereof. The storage device 724 may also include remote storage drives. The storage device 724 may include any number of applications 726 that are configured to run on the computing device 700. In embodiments, the computing device 700 is connected to an external storage device 704 using any USB standard.

The computing device 700 may also include a network interface controller (NIC) 728. The NIC 728 may be configured to connect the computing device 700 through the bus 706 to a network 730. The network 730 may be a wide area network (WAN), local area network (LAN), or the Internet, among others.

A print engine 732 that can send print jobs to a printing device 734. In embodiments, the print engine 732 is connected to the printer using any USB standard. The printing device 734 can include printers, fax machines, and other printing devices that can print images and documents using a print object module 736.

The block diagram of FIG. 7 is not intended to indicate that the computing device 700 is to include all of the components shown in FIG. 7. Further, the computing device 700 may include any number of additional components not shown in FIG. 7, depending on the details of the specific implementation.

EXAMPLE 1

An apparatus comprising an outer row of one or more surface mount technology (SMT) contacts and an inner row of one or more printed through holes (PTH). The outer row may be closer to an outer edge of the apparatus when compared to the inner row. The one or more surface mount technology contacts may transmit a Super Speed Data that is compatible with USB 3.0 data, and the one or more printed through holes may transmit data that is compatible with USB data, USB 1.0 data, USB 2.0 data, or any combination thereof. A data through put of the apparatus is equal to or greater than 10 Gb/s. Further, the apparatus may be configured in a manner that is visually inspected during manufacturing. The one or more printed through holes enable a retention force that satisfies a USB shock and vibration test. Moreover, a footprint of the one or more surface mount technology contacts and the one or more printed through holes maintains a signal integrity between data signals transmitted by the one or more surface mount technology contacts and the one or more printed through holes.

EXAMPLE 2

A hybrid USB footprint within a USB connection is described herein. The hybrid USB footprint includes an outer row of one or more surface mount technology (SMT) contacts, and an inner row of one or more printed through holes (PTH). The hybrid USB footprint may form a USB host connector, or the hybrid USB footprint may form a USB device connector. The outer row may be closer to an outer edge of the apparatus when compared to the inner row. The one or more surface mount technology contacts may transmit a Super Speed Data that is compatible with USB 3.0 data, and the one or more printed through holes may transmit data that is compatible with USB data, USB 1.0 data, USB 2.0 data, or any combination thereof. A data throughput of the footprint is greater than 5 Gb/s. The footprint may be configured in a manner that is visually inspected during manufacturing. Additionally, one or more printed through holes enable a retention force that satisfies a USB shock and vibration test.

EXAMPLE 3

A method for providing a hybrid USB footprint within a USB connection is described herein. The method includes generating an outer row of one or more surface mount technology (SMT) contacts, and generating an inner row of one or more printed through holes (PTH). The hybrid USB footprint may forms a USB host connector. Additionally, the hybrid USB footprint may form a USB device connector.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the inventions are not limited to those diagrams or to corresponding descriptions herein. For example, flow need not move through each illustrated box or state or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. An apparatus, comprising:
an outer row of one or more surface mount technology (SMT) contacts; and
an inner row of one or more printed through holes (PTH), wherein at least one via stub is removed and at least one printed through hole is a press fit contact.

2. The apparatus of claim 1, wherein the outer row is closer to an outer edge of the apparatus when compared to the inner row.

3. The apparatus of claim 1, wherein the one or more surface mount technology contacts transmit a Super Speed Data that is compatible with USB 3.0 data.

4. The apparatus of claim 1, wherein the one or more printed through holes transmit data that is compatible with USB data, USB 1.0 data, USB 2.0 data, or any combination thereof.

5. The apparatus of claim 1, wherein a data through put of the apparatus is equal to or greater than 10 Gb/s.

6. The apparatus of claim 1, wherein the apparatus is configured in a manner that is visually inspected during manufacturing.

7. The apparatus of claim 1, wherein the one or more printed through holes enable a retention force that satisfies a USB shock and vibration test.

8. The apparatus of claim 1, wherein a footprint of the one or more surface mount technology contacts and the one or more printed through holes maintains a signal integrity between data signals transmitted by the one or more surface mount technology contacts and the one or more printed through holes.

9. A hybrid USB footprint within a USB connection, comprising:
an outer row of one or more surface mount technology (SMT) contacts; and
an inner row of one or more printed through holes (PTH), wherein at least one via stub is removed and at least one printed through hole is a press fit contact.

10. The footprint of claim 9, wherein the hybrid USB footprint forms a USB host connector.

11. The footprint of claim 9, wherein the hybrid USB footprint forms a USB device connector.

12. The footprint of claim 9, wherein the outer row is closer to an outer edge of the apparatus when compared to the inner row.

13. The footprint of claim 9, wherein the one or more surface mount technology contacts transmit a Super Speed Data that is compatible with USB 3.0 data.

14. The footprint of claim 9, wherein the one or more printed through holes transmit data that is compatible with USB data, USB 1.0 data, USB 2.0 data, or any combination thereof.

15. The footprint of claim 9, wherein a data through put of the footprint is greater than 5 Gb/s.

16. The footprint of claim 9, wherein the footprint is configured in a manner that is visually inspected during manufacturing.

17. The footprint of claim 9, wherein the one or more printed through holes enable a retention force that satisfies a USB shock and vibration test.

18. A method for providing a hybrid USB footprint within a USB connection, comprising:
generating an outer row of one or more surface mount technology (SMT) contacts;
generating an inner row of one or more printed through holes (PTH), wherein at least one printed through hole is a press fit contact; and
removing at least one via stub from the one or more printed though holes.

19. The method of claim 18, wherein the hybrid USB footprint forms a USB host connector.

20. The method of claim 18, wherein the hybrid USB footprint forms a USB device connector.

* * * * *